(12) United States Patent
Chatterjee et al.

(10) Patent No.: US 7,016,239 B2
(45) Date of Patent: Mar. 21, 2006

(54) LEAKAGE TOLERANT REGISTER FILE

(75) Inventors: Bhaskar P. Chatterjee, Waterloo (CA); Steven K. Hsu, Lake Oswego, OR (US); Sriram R. Vangal, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 10/676,985

(22) Filed: Sep. 30, 2003

(65) Prior Publication Data

US 2005/0068801 A1 Mar. 31, 2005

(51) Int. Cl.
*G11C 7/00* (2006.01)

(52) U.S. Cl. ............. 365/189.12; 365/154; 365/189.08
(58) Field of Classification Search ........... 365/189.12, 365/154, 189.08, 230.05
See application file for complete search history.

(56) References Cited

U.S. PATENT DOCUMENTS

| | | | |
|---|---|---|---|
| 5,870,331 A * | 2/1999 | Hwang et al. | 365/154 |
| 6,104,642 A * | 8/2000 | Blomgren et al. | 365/189.02 |
| 6,204,696 B1 | 3/2001 | Krishnamurthy et al. | |
| 6,320,795 B1 * | 11/2001 | Balamurugan et al. | 365/189.08 |
| 6,510,077 B1 | 1/2003 | Alvandpour et al. | |
| 6,510,092 B1 | 1/2003 | Mathew et al. | |
| 6,549,040 B1 | 4/2003 | Alvandpour et al. | |
| 6,597,223 B1 | 7/2003 | Vangal et al. | |
| 6,597,623 B1 | 7/2003 | Krishnamurthy et al. | |
| 6,614,680 B1 | 9/2003 | Alvandpour et al. | |
| 6,618,316 B1 | 9/2003 | Hsu et al. | |
| 6,628,143 B1 | 9/2003 | Hsu et al. | |
| 6,628,557 B1 | 9/2003 | Hsu et al. | |
| 6,690,604 B1 * | 2/2004 | Hsu et al. | 365/189.05 |

* cited by examiner

*Primary Examiner*—Anh Phung
(74) *Attorney, Agent, or Firm*—Schwabe, Williamson & Wyatt, P.C.

(57) ABSTRACT

A register file contains a local bit trace and a driving signal trace as well as a plurality of data cells coupled to the local bit trace. A device is coupled to the driving signal trace and the local bit trace to intelligently charge and float the local bit trace. The intelligent charging and floating is facilitated by determination of a selection of one of the data cells.

30 Claims, 9 Drawing Sheets

FIG. 1 – Prior Art

LEAKAGE TOLERANT REGISTER FILE

BACKGROUND

1. Field of the Invention

This disclosure relates to integrated circuit design, and, more particularly to register file design.

2. Description of the Related Art

In today's computer systems, there are various levels of storage devices. These various levels of storage support different needs. For example, one need in some computer systems is the need for mass storage that are relatively low priced. This need is frequently met by large, inexpensive fixed-disk storage devices. The tradeoff for these large, inexpensive fixed-disk storage devices is that these devices have slow access times.

In comparison, there is, at times in certain systems, a need for memory devices that can provide very quick access for the reading and/or writing of data. A type of such memory devices is referred to as register files, which are often on the same die as a processing unit that accesses them, as they are accessed very frequently. In addition to quick access times, preferably, these devices are robust, and consume low power.

FIG. 1 illustrates a read portion of a prior art dynamic register file design. In this example, eight data cells 140 are multiplexed to support a dynamic local bit line 110. A clock signal 122 is used to precharge the dynamic local bit line 110 to a known value. Keeper circuit 130 is utilized to "keep" the precharged value on the dynamic local bit line 110 during an evaluation phase of a register file access. During the evaluation phase, for a set of eight data cells 140 possibly containing a data value to be "read", one of the read enable lines 142 may be used to enable the read of a corresponding data value 141. Upon the assertion of a read enable line 142, a corresponding stored data value may be driven on the local bit line 110. If no read enable line 142 is enabled for the set of eight data cells 140, the keeper circuit 130 is utilized to retain the precharged value on the local bit line 110. The local bit lines are then utilized to drive a subsequent multiplexing circuit to form a global bit line (not shown).

Applicants have recognized a number of conflicting requirements for efficient and/or effective implementations of such dynamic designs, especially in a new generation of high operating frequency integrated circuits. For example, in order to minimize the evaluation time and thus increase the operating frequency, it is desirable to use low threshold voltage transistors for transistors 144 and 148. However, leakage of current through transistors 144 and 148 will affect the robustness of this prior art design. Since lower threshold voltage transistors are more susceptible to leakage, they can not be employed without addressing their susceptibility. Leakage is undesirable as it may cause erroneous evaluations if too much charge is lost. In contrast, using high threshold voltage transistors results in an unacceptably long read delay as the increased threshold voltages increase response times.

Keeper circuits have been used to increase the robustness of the dynamic local bit line design. Keeper circuits are utilized to maintain the precharged value on the dynamic local bit line 110 in cases where low threshold voltage transistors 144 148 may otherwise allow the improper discharge of the precharged value via leakage current. In order to maintain the prechared value on the local bit line, an upsized transistor 132 is utilized as part of the keeper circuitry 130. However, this upsized keeper also results in a read delay that may be unacceptable for the next generation's high operating frequencies.

Thus, a register file design that is robust, while still being able to operate at high operating frequencies is desired.

BRIEF DESCRIPTION OF THE DRAWINGS

Embodiments of the present invention will be described referencing the accompanying drawings in which like references denote similar elements, and in which.

DETAILED DESCRIPTION OF EMBODIMENTS OF THE INVENTION

In the following description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

For the purpose of this application, the term "keeper" refers to a circuit added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A full-keeper is a circuit providing a switchable, direct, conductive pathway between the dynamic node and two voltage sources, e.g., a positive voltage and ground, and therefore operable to maintain the dynamic node at either a high or low level. A keeper-interrupt is a circuit providing a switchable, direct, conductive pathway between the dynamic node and a first voltage source, e.g., a positive voltage, and a switchable, indirect pathway between the dynamic node and a second voltage source, e.g., ground. In a keeper-interrupt circuit, there is at least one switchable circuit element coupled between the dynamic node and keeper-interrupt pathway to the second voltage source.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal salicides are examples of other conductors.

Figure 1:
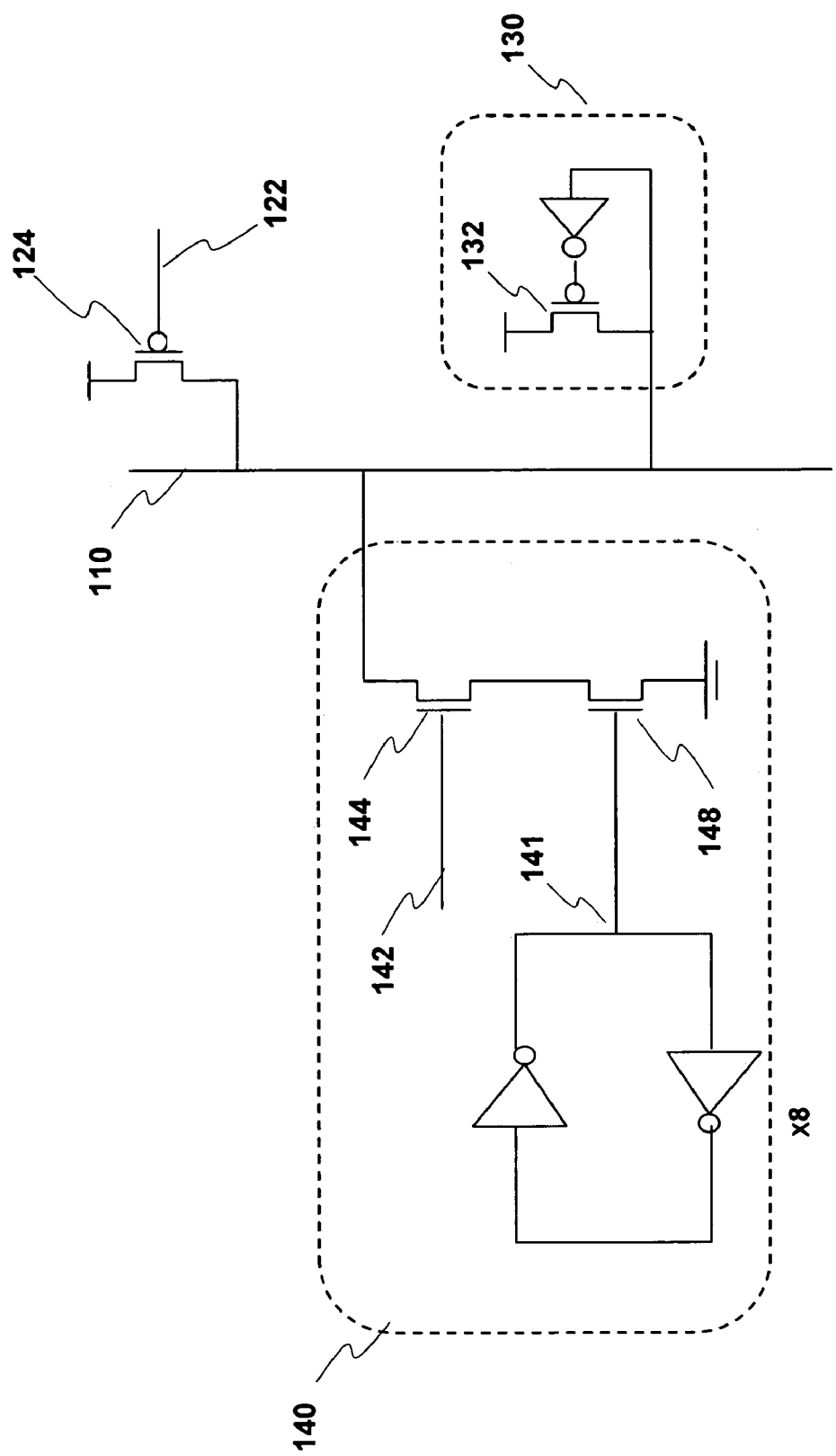
FIG. 1 (Prior Art) illustrates a read portion of a dynamic register file design.
Figure 2:
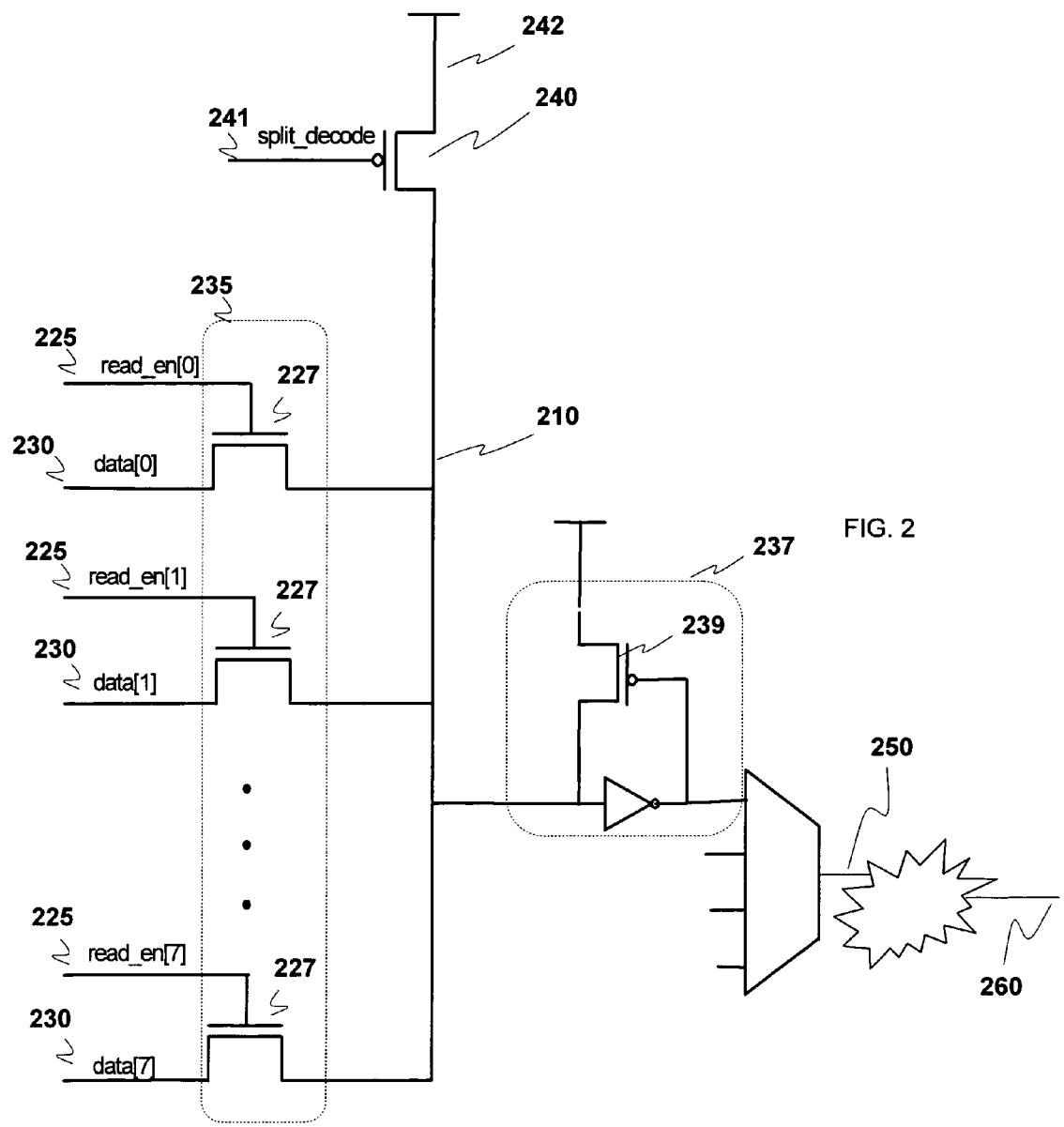
FIG. 2 illustrates a register file with a static, leakage tolerant local bit line, in accordance with one embodiment.

FIG. 2 illustrates a portion of a registerfile design including a static, leakage tolerant local bit trace, also known as local bit line, in accordance with one embodiment. Local bit line 210 is coupled to NMOS pass transistors 227 that provide access to data cell outputs 230. A data cell is a storage cell for maintaining a data value. In this embodiment, eight data cell outputs 230 may be coupled to a signal local bit line 210. The NMOS pass transistors 227 together form a data cell multiplexer 235.

Read enable signal traces 225 are coupled to the gate of NMOS pass transistors 227. In the embodiment shown, the read enable signals driving the read enable signal traces are one-hot, that is, only one read enable signal at a time is asserted. Having one read enable signal asserted results in a single data signal trace driving the local bit line 210.

A PMOS pullup transistor 240 is coupled to the local bit line 210 as well. The PMOS pullup transistor 240 may be driven by split decoder logic, to be. described more fully below. Keeper circuitry 237 is utilized to maintain values on the local bit line 210. The local bit line value may be fed to multiplexer circuit 250 to be multiplexed with four other local bit lines to eventually be used in the formation of a global bit line 260.

In comparison to conventional dynamic local bit lines, where local bit lines are charged to a voltage level during each precharge period and then allowed to float during an evaluation period, local bit line 210 is intelligently charged and floated. As discussed in greater detail below, split decode signal 241 is generated such that when a read enable signal 225 is to be generated for one of the data cells signal traces 230 driving the data cell multiplexer 235, the driving transistor 240 decouples the local bit line 210 from the driving signal trace 242. Thus, the "precharging" of the local bit line 210 is performed in an intelligent manner.

In the case of dynamic logic, in every clock cycle there is an evaluation phase where leakage current may discharge through low threshold voltage transistors. However, in the present design as described below, it is known when a value will be driven by one of data cell output signal traces 230 onto the local bit line 210. Thus, it is not required that high threshold voltage transistors be used in the data cell multiplexer 235 to ensure that current leakage through the transistors does not affect the logic value on the local bit line 210. This is because one of the NMOS pass transistors 227 will drive the local bit line whenever the driving signal trace 242 is decoupled from the local bit line 210. Therefore, even if low threshold voltage transistors are utilized in the design of the data cell multiplexer 235 there is little concern about current leakage through these devices since the data is always actively drive for a selected local bit line. Using low threshold voltage transistors for the NMOS pass transistors 227 is expected to reduce the amount of time required to activate the NMOS pass transistors 227.

Similarly, keeper circuitry 237 will only need to momentarily hold the value on the local bit line 210. The keeper circuitry 237 will need to "keep" the value on the local bit line 210 from the time the split decoder signal 241 decouples the driving signal trace 242 from the local bit line 210 only until the appropriate read enable signal 225 facilitates the coupling of the appropriate data cell output signal trace 230, onto the local bit line 210. Thus, the keeper transistor 239 may be a relatively small one, thus reducing the amount of time local bit line 210 takes to respond to the coupling to a data cell output signal trace 230.

Figure 3A:
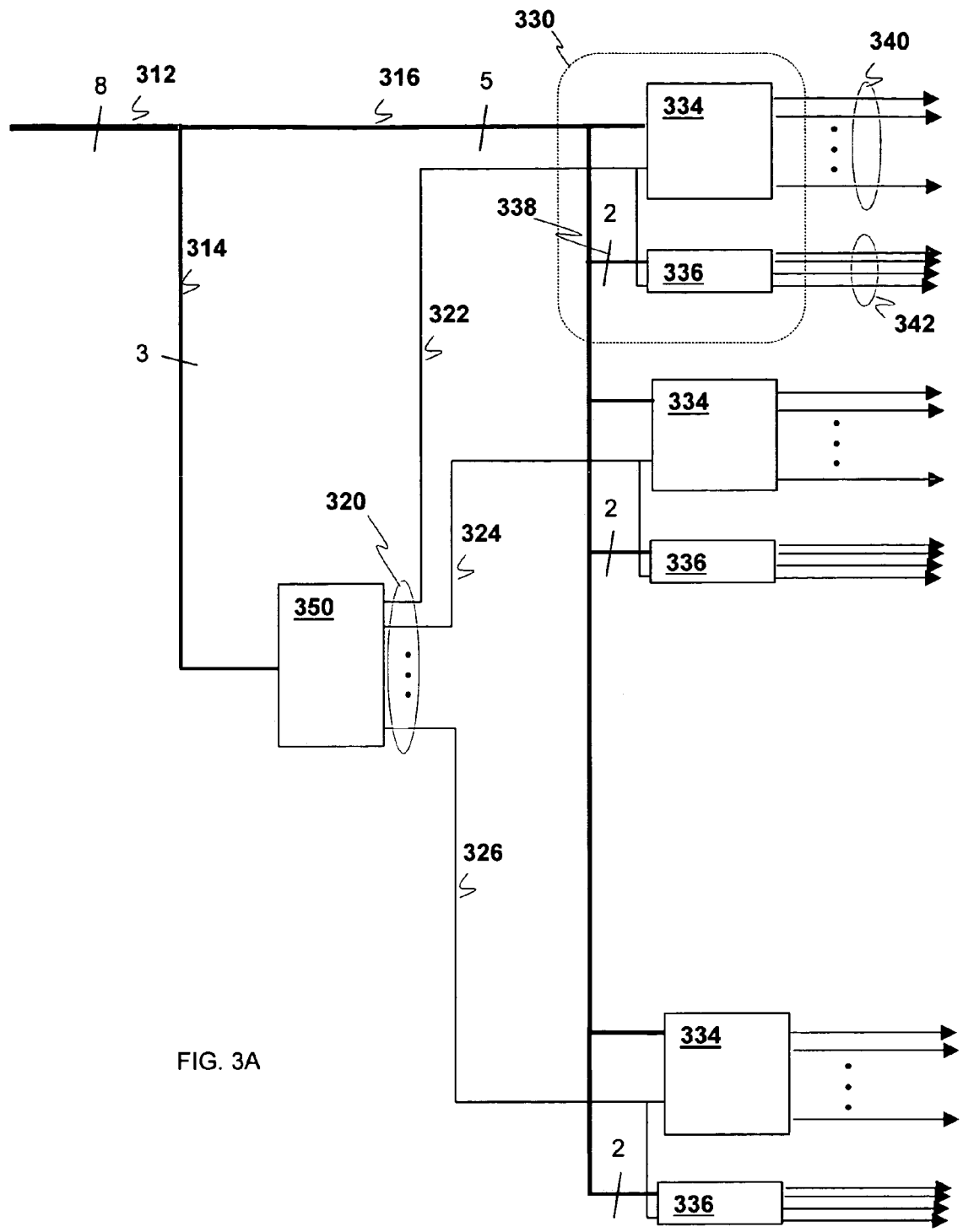
FIG. 3A illustrates a split level decoder in accordance with one embodiment.

FIG. 3A illustrates a split level decoder in accordance with one embodiment. Signals on eight address line traces (bits) 312 are utilized to identify a particular bit of 256 bits to be decoded. A multiple-level decoding operation is performed to allow for separate generation of read enable signals and the split decoder signal discussed above. In the embodiment shown, in the first level of the decode logic, the three upper most significant address line traces 314 of the eight address lines traces are utilized to generate selectors 320 for the split decode logic. In the embodiment illustrated, a three to eight decoder 350 may be utilized as the first level of decode logic to generate the selectors 320.

Eight banks of second level decode logic 330 are provided to generate signals for selecting the proper bit of the device, e.g. the read enable and split decoder signals. Selectors 320 provide a one-hot identification of the corresponding second level decode logic bank 330. Each second level decode logic bank 330 contains a read enable logic block 334 and a split decoder logic block 336.

Read enable logic blocks 334 generate read enable signals on lines 340. The read enable signals are for use in enabling logic that drives an appropriate bit onto the local bit line. For example, as discussed in the embodiment associated with FIG. 2, an NMOS pass transistor 227 may be utilized to drive values of data cell output traces 230 onto a local bit line 210. Each read enable logic block 334 contains decode logic to properly decode the lower five address bits to facilitate the production of 32 read enable signals on lines 340. Such address decode logic is known in the art and will not be described further. Also utilized in the production of the 32 read enable signals for lines 340 is the selector 322 from the set of selectors 320. This selector 322 is utilized to ensure that the read enable signals 340 are only asserted when the address provided via address bits 312 actually corresponds to a data cell associated with the appropriate second level decode block 330.

The split decoder logic block 336 generates split decoder signals on lines 342. The split decoder signals are for use in driving split decoder logic as discussed herein. In the embodiment shown, the split decoder logic block 336 utilizes two address lines 338 in the generation of the split decoder signals. As with the read enable signals 340, selector 322 is utilized to ensure that the appropriate split decoder signals 342 are only asserted when the address provided 312 actually corresponds to a data cell associated with the appropriate second level decode block 330.

Referring again to the embodiment of FIG. 2, it is desirable to have the PMOS pull-up transistor 240 cease driving the local bit line 210 prior to the driving of the local bit line by the NMOS pass transistors 227. This reduces the contention on the local bit line 210 allowing for, among other things, faster read times. By having the split decoder signal on line 241 arrive before the read enable signal on line 225, the local bit line 210 floats before the NMOS pass transistor 227 drives the data value on the local bit line 210, thus reducing the contention on the local bit line.

Since the split decoder signals 342 are generated utilizing the selector and two address lines 338, the split decoder signals are available earlier than the read enable signals 340. This is because the read enables signals 340 are generated from five address bits, in comparison to the two address bits used by the split decoder, thus the read enable signals may require a longer period to decode. The additional decode time associated with the five bit decode delays the read enable signal 340 generation relative to the split decoder signal 342 generation. This may reduce contention on the local bit line.

In addition, in the embodiment illustrated in FIG. 2, there is an additional factor influencing reducing the contention on the local bit line 210. The split decoder signal drives a PMOS pull-up transistor 240 whereas the read enable signal drives an NMOS pass transistor. The PMOS device has a reduced load in comparison to an NMOS device, thus resulting in a quicker response time. This quicker response time may further contribute to ensuring that the supply voltage 242 is decoupled from the local bit line 210 prior to the local bit line being driven by a data cell.

Figure 3B:
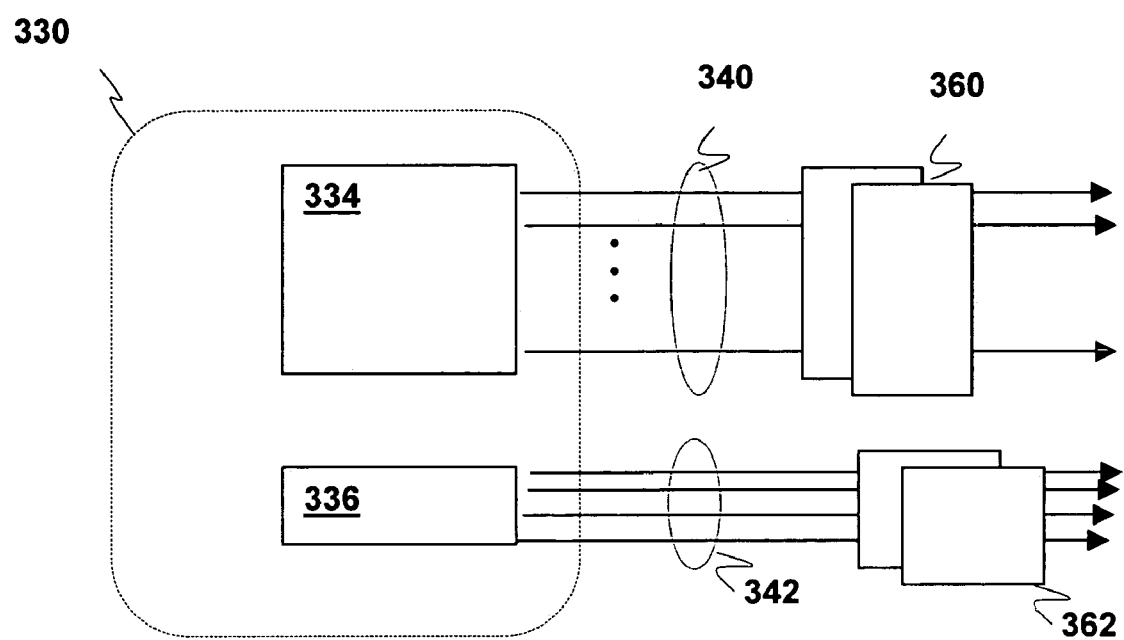
FIG. 3B illustrates an alternative split level decoder output architecture in accordance with another embodiment.

FIG. 3B illustrates an alternative output stage for the read enable signals 340 and the split decoders signals 342, in accordance with another embodiment. Illustrated is a second level decode logic bank 330 including a read enable logic block 334 and a split decoder logic block 336. However, the outputs 340 342 of both the read enable logic block 334 and the split decoder logic block 336 are registered via flip flops 360 362, respectively. While this architecture may not pass through the advantages of the earlier decode time for the split decoder signals as discussed above, the reduced load of the PMOS device driving the bit line may provide sufficient response time to avoid contention on the local bit line.

Figure 4:
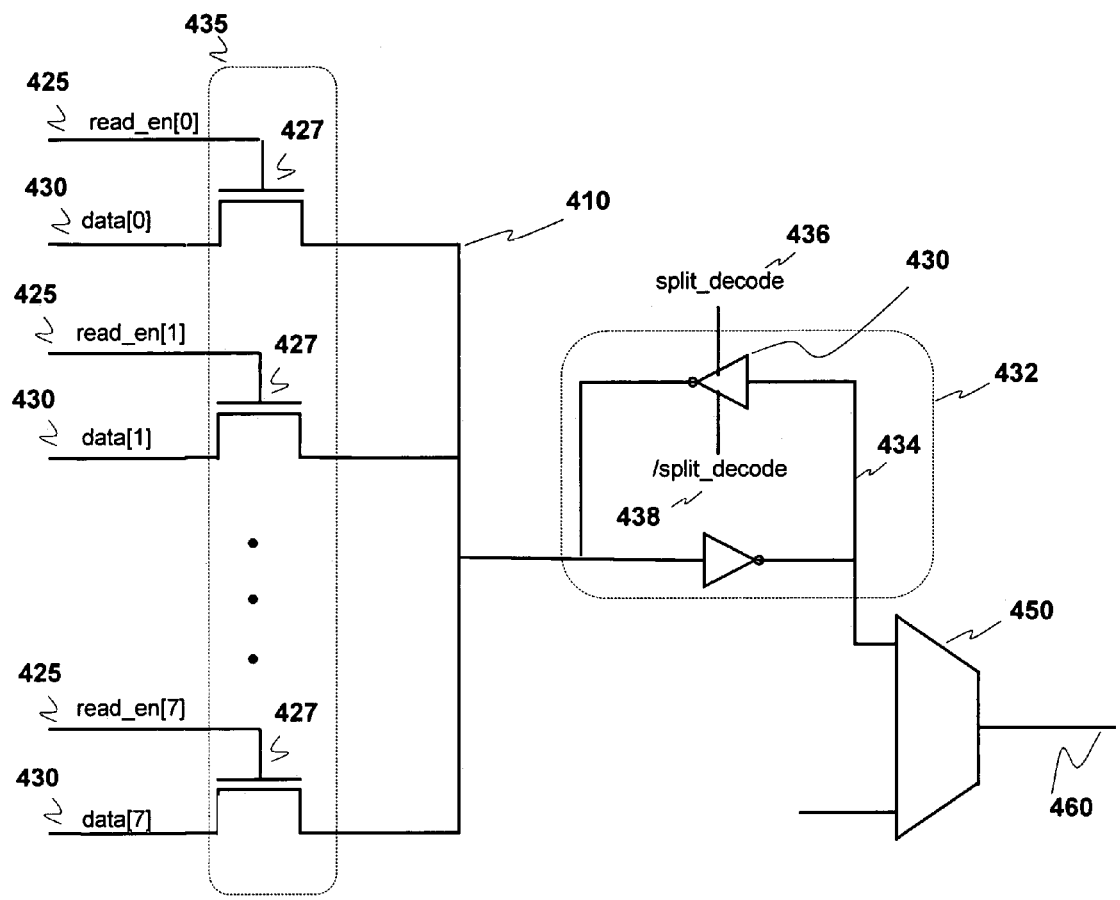
FIG. 4 illustrates a leakage tolerant local bit line design in accordance with another embodiment.

FIG. 4 illustrates a leakage tolerant local bit line design in accordance with another embodiment. In this embodiment, a data cell multiplexer 435 containing transistors 427, driven by data inputs 430 and read enables 425, drives a local bit line 410 similar to the embodiment of FIG 2. However, this architecture utilizes a fully interruptible cross-coupled inverter stage 432. When any of the read enable signals 425 are active, the split decoder 436 and split decoder inversion 438 signals are asserted. This assertion causes an interrupt in the feedback of the cross-coupled inverter stage 432. This interruption allows the local bit line 410 to float. In this manner, when the data cell value 430 is enabled by the read enable signal 425, there will not be contention for the local bit line 410. This will allow low threshold pass transistors to be used in the construction of the data cell thus contributing to decreasing read response time and increasing the operating frequency.

Figure 5:
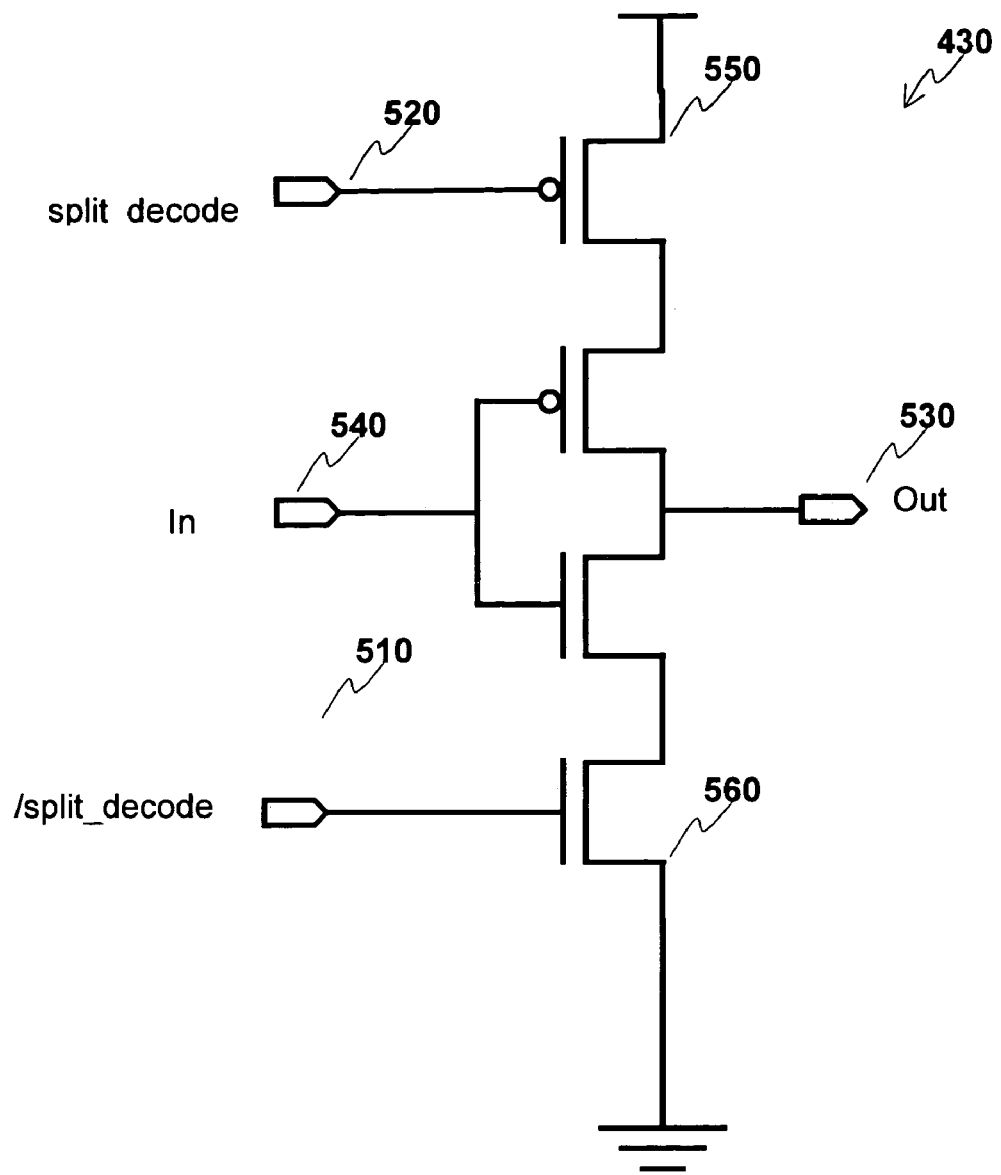
FIG. 5 illustrates the interruptible inverter of FIG. 4 in further detail, in accordance with one embodiment.

FIG. 5 illustrates an interruptible inverter 430 for use in the circuit of FIG. 4, in accordance with one embodiment. In this embodiment, signals generated by the split decoding logic, indicating that a driving signal is to be removed from a local bit line, are utilized in the control of the interruptible inverter 430. In this embodiment, the driving signal is the value currently on an intermediate node 434 cross-coupled inverter stage 432. Split decoder signal 520 and split decoder's inversion signal 510 may be used to decouple the output of the inverter 530 from the input to the inverter 540, thus providing an interruptible inverter. In the embodiment illustrated, when the split decoder signal is asserted, the split_decode signal 520 will be high disabling PMOS device 550. Similarly, the /split_decode signal 510 is low when the split decoder signaling is asserted and NMOS device 560 is also disabled. This leaves output signal 530 undriven thus removing driving signal 434 from local bit line 410.

Figure 6:
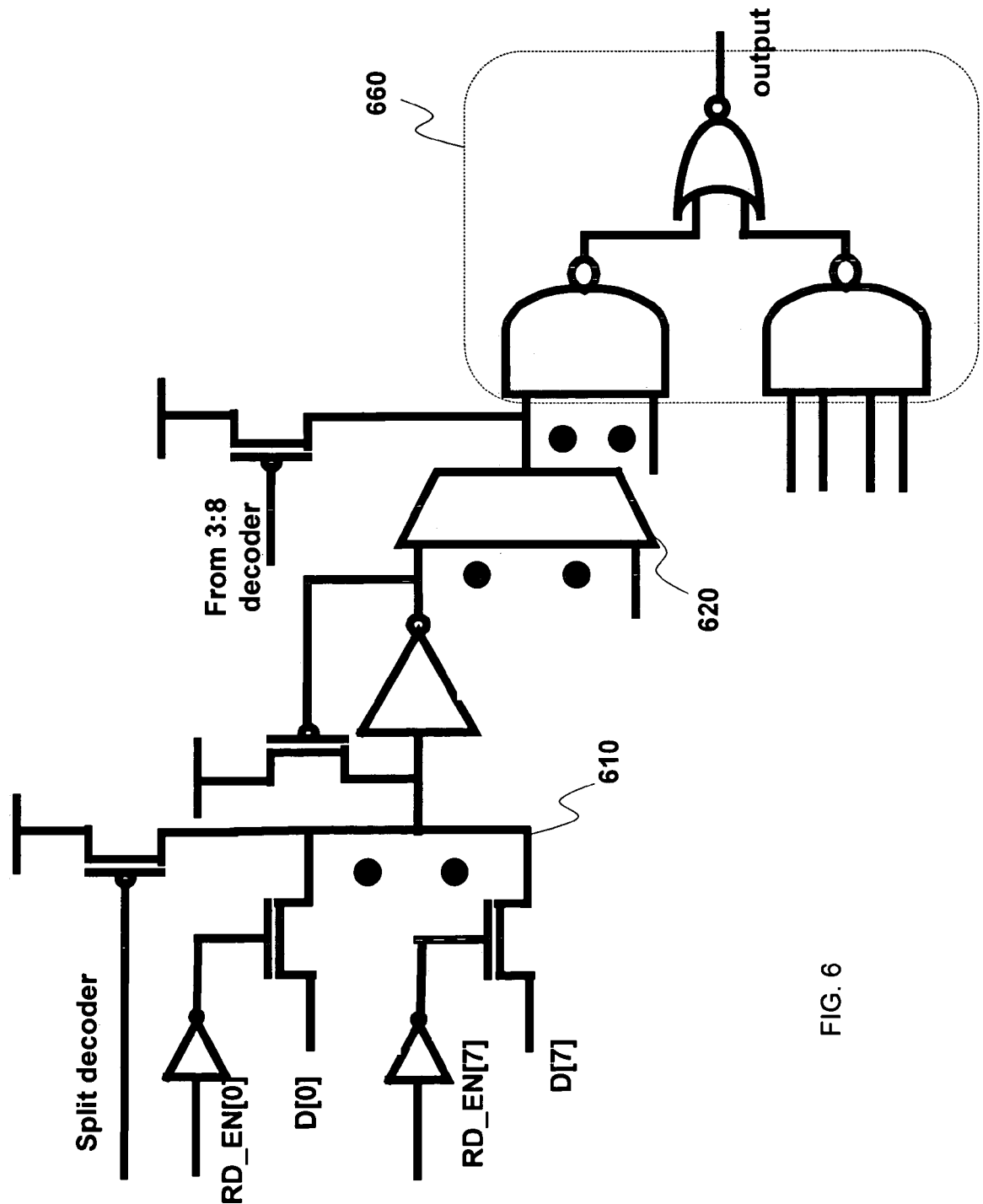
FIG. 6 illustrates one path through a 256-bit register file, in accordance with one embodiment.

FIG. 6 illustrates one path through a 256 bit register file, in accordance with one embodiment. Static local bit line 610 is coupled to the output of eight data cells, in a manner discussed with respect to the embodiment illustrated in FIG. 2. Output from static local bit line 610 is multiplexed together with outputs from three other static local bit lines in an intermediate multiplexing stage via multiplexing logic 620. Outputs of these intermediate stages are then further multiplexed together in an output multiplexing stage 660.

Figure 7:
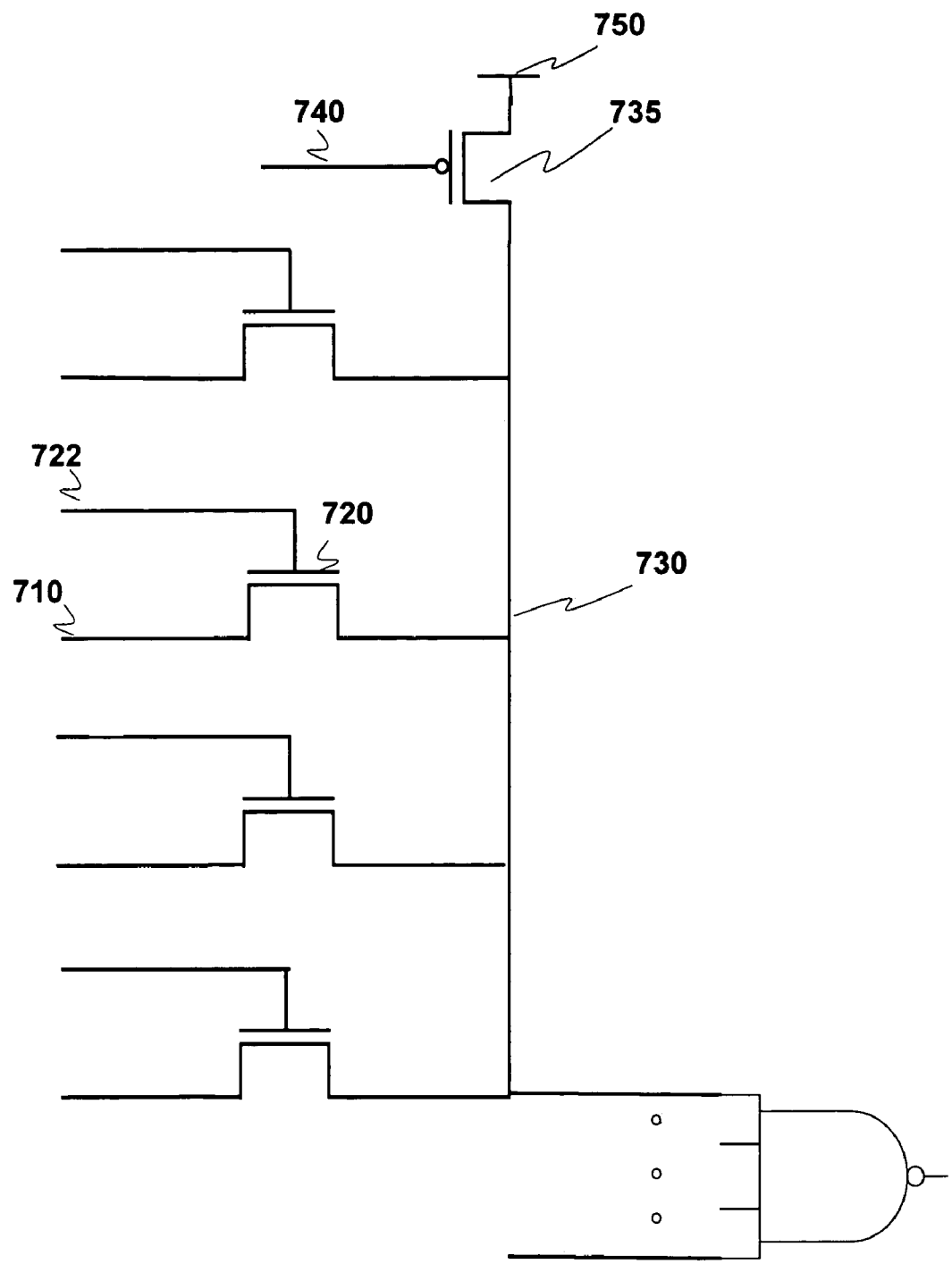
FIG. 7 illustrates a four-bit, intermediate multiplexing stage, in accordance with one embodiment.

FIG. 7 illustrates a four-bit, intermediate multiplexing stage, in accordance with one embodiment. Static local bit line outputs 710 drive multiplexed NMOS transistors 720. Gates 722 of these multiplexed NMOS transistors 720 are controlled by the corresponding split decoder signal that facilitated decoupling the driving signal from the local bit line. Thus, when a local bit line contains valid data that is being read from a specified location, corresponding transistor 720 will pass the value to intermediate bit line 730. In the embodiment illustrated, the intermediate bit line 730 is driven high by PMOS device 735 when the intermediate multiplexing stage contains no actively driven local bits. When one of the four multiplexor inputs contains valid to be provided to an output, control signal 740 is asserted, thus removing supply voltage 750 from intermediate bit line 730.

An example of control logic that may be utilized to enable PMOS device 735 is the control logic utilized to generate selector signals 320, in accordance with the embodiment illustrated in FIG. 3. The 3 to 8 decoder output provides an indication to the appropriate one of the eight second level decode bankso to generate a read enable signal. In the embodiment illustrated, each intermediate bit line is driven by a subset of the total bits that corresponds to the bits driven by the second level decode banks. Thus, the decode signals will provide an indication of which of the intermediate bit lines will contain a validly selected bit.

Figure 8:
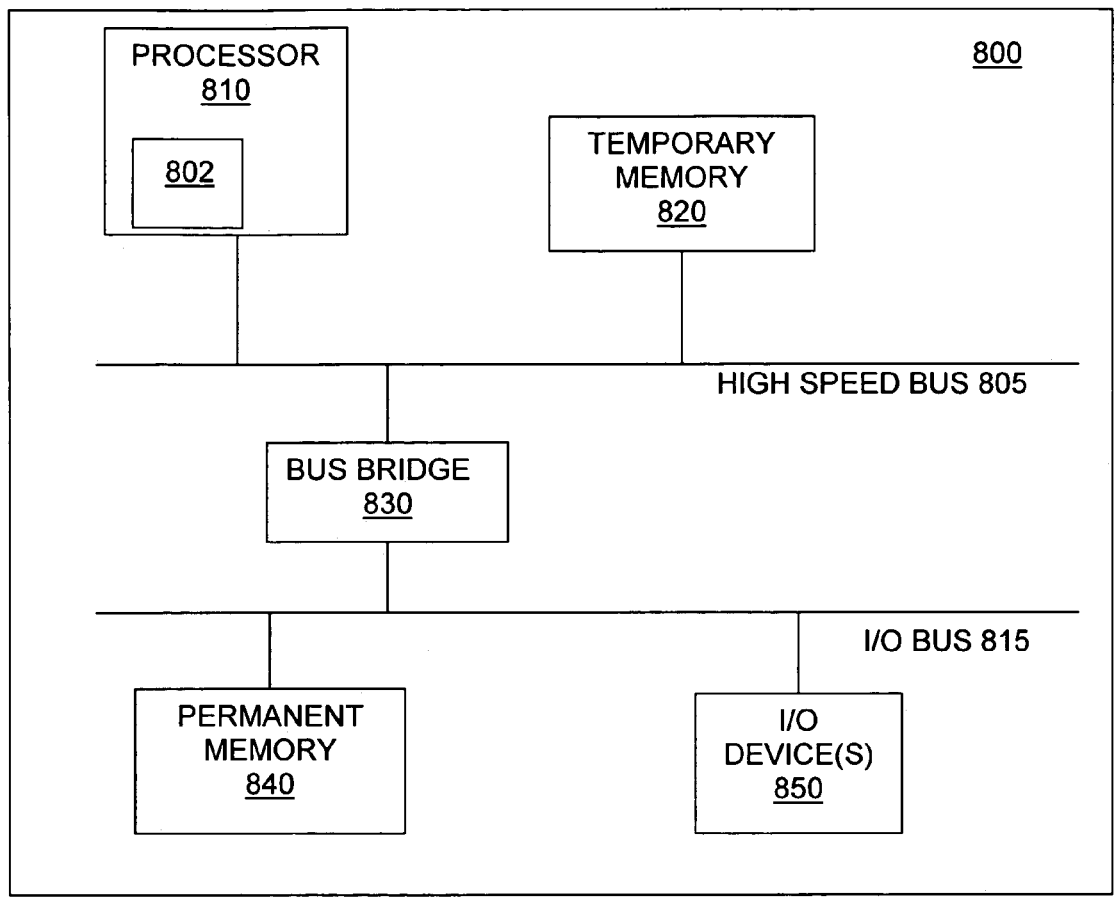
FIG. 8 illustrates is a block diagram of a computer system including a high operating frequency, yet robust, register file.

FIG. 8 illustrates is a block diagram of a computer system 800 including a high operating frequency yet robust register file 802. As shown, the computer system 800 includes a processor 810 and temporary memory 820, such as SDRAM and DRAM, on high-speed bus 805. Register file 802, incorporated with the earlier described leakage tolerant and/or split decoder teachings, advantageously provides high speed, yet robust, access to memory for processor 810. High-speed bus is connected through bus bridge 830 to input/output (I/O) bus 815. I/O bus 815 connects permanent memory 840, such as flash devices and fixed disk device, and I/O devices 850 to each other and bus bridge 830.

Thus, a unique design of a register file for provision of high-speed access to stored data is provided. While the invention has been described in accordance with a number of embodiments, the invention should not be considered so limited. One skilled in the art will recognize that various other embodiments can be utilized to provide the advantages described herein.

What is claimed is:

1. A register file comprising:
   a local bit trace;
   a driving signal trace;
   a plurality of data cells coupled to the local bit trace; and
   a device coupled to the driving signal trace and the local bit trace to intelligently charge and float the local bit trace, the intelligent charging and floating facilitated by determination of a selection of one of the data cells.

2. The register file of claim 1 wherein the intelligent charging and floating comprises selectively coupling and decoupling the driving signal trace and the local bit trace to and from each other, including decoupling the driving signal trace from the local bit trace when one of the data cells is selected.

3. The register file of claim 1 wherein the device comprises at least one interruptible inverting logic stage and wherein an input of the interruptible inverting logic stage is coupled to the driving signal trace and wherein an output of the inverting logic stage is coupled to the local bit trace.

4. The register file of claim 1 wherein the driving signal trace comprises a power supply trace.

5. The register file of claim 4 wherein the device comprises a PMOS transistor and wherein a drain of the PMOS transistor is coupled to the driving signal trace and a source of the PMOS transistor is coupled to the local bit trace.

6. The register file of claim 1 further comprising first decode logic coupled to the device to signal the device on the selection of one of the data cells.

7. The register file of claim 6 further comprising a plurality of address signal traces coupled to the first decode logic, which determines the selection of one of the data cells based on a first subset of the plurality of address signal traces.

8. The register file of claim 7 wherein the first subset of the plurality of address signal traces include one or more most significant bits of the address signal traces.

9. The register file of claim 1 further comprising a plurality of low threshold voltage transistors to couple the plurality of data cells to the local bit trace.

10. The register file of claim 10 further comprising second decode logic coupled to the low threshold voltage transistors to provide the transistors with read enable signals based at least in part on the second decode logic's decoding of a second subset of the address signal traces.

11. A register file comprising:
a first and a second local bit trace;
a first and a second driving signal trace;
a plurality of data cells wherein a first subset of the plurality of data cells is coupled to the first local bit trace and a second subset of the plurality of data cells is coupled to the second local bit trace;
a first device coupled to the first driving signal trace and the first local bit trace and a second device coupled to the second driving signal trace and the second local bit trace, the first and second devices to intelligently charge and float the respective first and second local bit traces, the intelligent charging and floating facilitated by determination of a selection of one of the data cells in the plurality of data cells; and
global multiplexing logic coupled to the first and second local bit traces to facilitate provision of a selected data value of the address data cell on an output signal trace.

12. The register file of claim 1 wherein the intelligent charging and floating comprises selectively coupling and decoupling the respective driving signal trace and the respective local bit trace to and from each other, including decoupling the first driving signal trace from the first local bit trace and coupling the second driving signal trace to the second local bit trace when the addressed data cell is a data cell from the first subset of the plurality of data cells.

13. The register file of claim 11 wherein at least one of the first device and the second device comprises at least one interruptible inverting logic stage and wherein an input of the interruptible inverting logic stage is coupled to the respective driving signal trace and wherein an output of the inverting logic stage is coupled to the respective local bit trace.

14. The register file of claim 11 wherein at least one of the first device and the second device comprises a PMOS transistor and wherein a drain of the PMOS transistor is coupled to the respective driving signal trace and a source of the PMOS transistor is coupled to the respective local bit trace.

15. The register file of claim 11 further comprising first and second decode logic coupled to the first and second device respectively, the first and second decode logic to signal the respective device on the selection of one of the data cells.

16. The register file of claim 15 further comprising a plurality of address signal traces coupled to the first and second decode logic, which determines the selection of one of the data cells based on a first subset of the plurality of address signal traces.

17. The register file of claim 16 further wherein the first subset of the plurality of address signal traces include one or more most significant bits of the address signal traces.

18. The register file of claim 11 further comprising a first and second plurality of low threshold voltage transistors to respectively couple the first and second subset of plurality of data cells to the first and second local bit traces respectively.

19. The register file of claim 18 further comprising third and forth decode logic coupled to the first and second plurality of low threshold voltage transistors to provide the transistors with read enable signals based at least in part on the third and forth decode logic's decoding of a second subset of the address signal traces.

20. A method comprising:
determining whether a set of data cells comprises a selected data cell; and
conditionally electrically decoupling a driving signal trace from a local bit trace upon said determining, said local bit trace coupled to said set of data cells.

21. The method of claim 20 wherein said determining comprises decoding a first subset of address bits.

22. The method of claim 21 wherein said first subset of address bits comprises one or more most significant bits of a set of address bits.

23. A system comprising:
a processor including;
a register file comprising:
a first and a second local bit trace;
a first and a second driving signal trace;
a plurality of data cells wherein a first subset of the plurality of data cells is coupled to the first local bit trace and a second subset of the plurality of data cells is coupled to the second local bit trace;
a first device coupled to the first driving signal trace and the first local bit trace and a second device coupled to the second driving signal trace and the second local bit trace, the first and second devices to intelligently charge and float the respective first and second local bit traces, the intelligent charging and floating facilitated by determination of a selection of one of the data cells in the plurality of data cells; and
global multiplexing logic coupled to the first and second local bit traces to facilitate provision of a selected data value of the address data cell on an output signal trace;
a memory configured to store data; and a bus coupled to the processor and memory to facilitate data exchange between the processor and memory.

24. The system of claim 23 wherein the intelligent charging and floating comprises selectively coupling and decoupling the respective driving signal trace and the respective local bit trace to and from each other, including decoupling the first driving signal trace from the first local bit trace and coupling the second driving signal trace to the second local bit trace when the addressed data cell is a data cell from the first subset of the plurality of data cells.

25. The system of claim 23 wherein at least one of the first device and the second device comprises at least one interruptible inverting logic stage and wherein an input of the interruptible inverting logic stage is coupled to the respective driving signal trace and wherein an output of the inverting logic stage is coupled to the respective local bit trace.

26. The system of claim 23 wherein at least one of the first device and the second device comprises a PMOS transistor and wherein a drain of the PMOS transistor is coupled to the respective driving signal trace and a source of the PMOS transistor is coupled to the respective local bit trace.

27. The system of claim 23 wherein the register file further comprises first and second decode logic coupled to the first and second device respectively, the first and second decode logic to signal the respective device on the selection of one of the data cells.

28. The system of claim 27 wherein the register file further comprises a plurality of address signal traces coupled to the first and second decode logic, which determines the selection of one of the data cells based on a first subset of the plurality of address signal traces.

29. The system of claim 28 wherein the first subset of the plurality of address signal traces includes one or more most significant bits of the address signal traces.

30. The system of claim 23 wherein the register file further comprises a first and second plurality of low threshold voltage transistors to respectively couple the first and second subset of plurality of data cells to the first and second local bit traces respectively.

* * * * *

UNITED STATES PATENT AND TRADEMARK OFFICE
CERTIFICATE OF CORRECTION

PATENT NO. : 7,016,239 B2  Page 1 of 1
APPLICATION NO. : 10/676985
DATED : March 21, 2006
INVENTOR(S) : Chatterjee et al.

It is certified that error appears in the above-identified patent and that said Letters Patent is hereby corrected as shown below:

Title Page, item [75] should read
-- Inventors:
Bhaskar P. Chatterjee, Waterloo (CA);
Steven K. Hsu, Lake Oswego, OR (US);
Sriram R. Vangal, Portland, OR (US);
Ram Krishnamurthy, Portland, OR (US);
Sapumal Wijeratne, Portland, OR (US);
Pankaj Aswal, Beaverton, OR (US) --

Column 5, lines 23-24, "...supply voltage 242 " should read --...driving signal trace 242...--;
Column 7, line 32, "...claim 10..." should read --...claim 1 --; and
Column 7, line 56, "...claim 1..." should read --...claim 11 --.

Signed and Sealed this

Fifth Day of December, 2006

JON W. DUDAS
*Director of the United States Patent and Trademark Office*